(12) United States Patent
Lee et al.

(10) Patent No.: US 8,590,147 B2
(45) Date of Patent: Nov. 26, 2013

(54) METHOD FOR FABRICATING CIRCUIT BOARD STRUCTURE WITH CONCAVE CONDUCTIVE CYLINDERS

(75) Inventors: Shao-Chien Lee, Taoyuan County (TW); Chih-Ming Chang, Tinan (TW)

(73) Assignee: Unimicron Technology Corp., Taoyuan (TW)

( * ) Notice: Subject to any disclaimer, the term of this patent is extended or adjusted under 35 U.S.C. 154(b) by 997 days.

(21) Appl. No.: 12/652,226

(22) Filed: Jan. 5, 2010

(65) Prior Publication Data

US 2010/0101083 A1 Apr. 29, 2010

Related U.S. Application Data

(62) Division of application No. 11/870,182, filed on Oct. 10, 2007, now abandoned.

(30) Foreign Application Priority Data

Jul. 25, 2007 (TW) .............................. 96127050 A

(51) Int. Cl.
*H01K 3/10* (2006.01)
(52) U.S. Cl.
USPC ................. 29/852; 29/830; 29/831; 29/846; 174/252
(58) Field of Classification Search
USPC ..................... 29/830, 831, 846, 852; 174/252
See application file for complete search history.

(56) References Cited

U.S. PATENT DOCUMENTS

| 4,991,285 A * | 2/1991 | Shaheen et al. ................. 29/830 |
| 5,146,674 A * | 9/1992 | Frankeny et al. ................ 29/830 |
| 6,353,997 B1 * | 3/2002 | Su ................................... 29/830 |

FOREIGN PATENT DOCUMENTS

| TW | 582190 | 4/2004 |
| TW | I267969 | 12/2006 |

OTHER PUBLICATIONS

Chinese Examination Report of Taiwan patent Application No. 096127050, dated Sep. 9, 2010.

* cited by examiner

*Primary Examiner* — Carl Arbes
(74) *Attorney, Agent, or Firm* — J.C. Patents

(57) ABSTRACT

A method of fabricating a circuit board structure with concave conductive cylinders is provided. Firstly, a conductive layer is provided and a dielectric layer is formed on a surface of the conductive layer. Next, a plurality of vias is formed in the dielectric layer, where the vias are exposed on the surface of the conductive layer. A conductive material is then filled in the vias to form a plurality of conductive cylinders on the surface of the conductive layer, so that the tips of the conductive cylinders are exposed on a surface of the dielectric layer relatively far away from the conductive layer. The exposed tips of the conductive cylinders are removed, so that the height of the conductive cylinders is lower than the dielectric layer and the conductive cylinders sunk into the dielectric layer.

7 Claims, 4 Drawing Sheets

METHOD FOR FABRICATING CIRCUIT BOARD STRUCTURE WITH CONCAVE CONDUCTIVE CYLINDERS

CROSS-REFERENCE TO RELATED APPLICATION

This application is a divisional application of and claims the priority benefit of U.S. application Ser. No. 11/870,182, filed on Oct. 10, 2007, now pending, which claims the priority benefit of Taiwan application serial no. 96127050, filed on Jul. 25, 2007. The entirety of each of the above-mentioned patent applications is hereby incorporated by reference herein and made a part of this specification.

BACKGROUND OF THE INVENTION

1. Field of the Invention

The invention relates to a circuit board structure and the fabricating method thereof, more specifically, the invention relates to a circuit board structure with concave conductive cylinders and the fabricating method thereof.

2. Description of Related Art

Generally, conventional circuit boards used to carry and electrically connect a plurality of electronic elements are mainly formed with a plurality of interlayered patterned conductive layers and dielectric layers. The patterned conductive layers are defined and formed through patterning copper foil directly, or through copper electroplating upon copper foil to increase the thickness of conductive layer and then go through a patterning process. The dielectric layers are respectively disposed between these adjacent patterned conductive layers to insulate these patterned conductive layers. In addition, the interlayered patterned conductive layers are electrically connected to each other through conductive vias. In addition, various electronic elements (e.g. active elements or passive elements) may be further disposed on a surface of the circuit board, and through the internal circuit in the circuit board to realize electrical signal propagation.

FIG. 1 is a section view of a circuit board of prior arts. With reference to FIG. 1, a patterned conductive layer 120 of a circuit board 100 of prior arts is disposed on a dielectric layer 110, and the patterned conductive layer 120 has a plurality of pads 122. A patterned solder mask layer 130 is disposed on the dielectric layer 110 to cover a portion of the patterned conductive layer 120. The patterned solder mask layer 130 has a plurality of openings 132 to expose these pads 122. In addition, a plurality of solder balls 140 are respectively disposed on these pads 122 and are respectively electrically connected to these pads 122.

However, during the fabricating process of the circuit board 100 of prior arts, when the patterned solder mask layer 130 is formed, the locations of the openings 132 may not be accurately aligned to the pads 122, and drifts may occur accordingly. And therefore a portion of the pads 122 (with reference to the pads 122 on the right side of FIG. 1) are covered too much by the patterned solder mask layer 130. In addition, when an image transfers, light leaking, under exposure, less developing power or incomplete development may also lead to too small openings 132. Therefore, when the solder balls 140 are respectively formed on the pads 122, the contact area between a portion of the solder balls 140 (with reference to the solder balls on the right side of FIG. 1) and the corresponding pads 122 become small, therefore the bonding reliability between a portion of the solder balls 140 and the corresponding pads 122 is reduced.

SUMMARY OF THE INVENTION

The invention provides a circuit board structure with concave conductive cylinders and the fabricating method thereof, for fabricating circuit board structure with concave conductive cylinders, so that the bonding quality between solder material and conductive cylinder is better.

The invention provides a fabricating method of circuit board structure with concaved conductive cylinders. The method includes: providing a conductive layer first; forming a plurality of conductive cylinders on a surface of the conductive layer; forming a dielectric layer on the surface of the conductive layer on which the conductive cylinders are formed; exposing the tips of these conductive cylinders out of a surface of the dielectric layer relatively far away from the conductive layer; removing the tips of the conductive cylinders, so that the height of the conductive cylinders is lower than the height of the dielectric layer and the conductive cylinders sunk into the dielectric layer.

In an embodiment of the invention, the step of forming the conductive cylinders includes partially etching the conductive layers.

In an embodiment of the invention, the step of forming the dielectric layer includes laminating or printing a dielectric material on the surface of the conductive layer on which the conductive cylinders are formed.

In an embodiment of the invention, the method of removing the exposed tips of the conductive cylinders includes etching.

In an embodiment of the invention, after the exposed tips of these conductive cylinders are removed, the present method further includes disposing a solder material on the conductive cylinders sunk into the dielectric layer, so as to rise the solder material above the dielectric layer.

The invention further provides a method of fabricating the circuit board with concave conductive cylinders. The method includes: providing a conductive layer first; forming a dielectric layer on a surface of the conductive layer; forming a plurality of vias in the dielectric layer, wherein the vias are exposed on the surface of the conductive layer; filling a conductive material in the vias to form a plurality of conductive cylinders on the surface of the conductive layer, so that the tips of the conductive cylinders are exposed on a surface of the dielectric layer relatively far away from the conductive layer; and removing the exposed tips of the conductive cylinders, so that the height of the conductive cylinders is lower than the dielectric layer and the conductive cylinders sunk into the dielectric layer.

In an embodiment of the invention, the step of forming the dielectric layer includes laminating or printing a dielectric material on the surface of the conductive layer.

In an embodiment of the invention, the method of forming the vias includes laser drilling.

In an embodiment of the invention, the method of filling the conductive material in the vias includes electroplating, screen printing conductive glue or conductive polymeric material.

In an embodiment of the invention, the conductive glue includes copper paste or silver paste.

In an embodiment of the invention, the method of removing the exposed tips of the conductive cylinders includes grinding or etching.

In an embodiment of the invention, after the exposed tips of the conductive cylinders are removed, the present method further includes disposing a solder material on the conductive cylinders sunk into the dielectric layer to rise the solder material above the dielectric layer.

The invention further provides a circuit board structure with concave conductive cylinders, including a conductive layer, a plurality of conductive cylinders and a patterned dielectric layer. The conductive cylinders are formed on a surface of the conductive layer and are electrically connected to the conductive layer. The patterned dielectric layer covers a surface of the conductive layer, wherein the tips of the conductive cylinders are exposed on a surface of the patterned dielectric layer far away from the conductive layer, and the height of these conductive cylinders is lower than the patterned dielectric layer and the conductive cylinders sunk into the patterned dielectric layer.

In an embodiment of the invention, the circuit board structure further includes a solder material layer, formed on the conductive cylinders to rise above the patterned dielectric layer.

Since the invention forms the dielectric layer on the outside of the conductive layer, to substitute the function of solder mask layer, therefore the solder mask opening drift problem occurred in the prior arts because the solder mask layer has to align with the pads, or the problem that the solder mask openings are too small when image transfers can be avoided. In addition, since the conductive cylinders are sunk into the dielectric layer, so that the solder material can be filled in the dielectric layer and to effectively bond to the conductive cylinders, therefore the bonding reliability of the solder material and the conductive cylinders can be improved, and disposing pads is no more required.

In order to the make the aforementioned and other features and advantages of the invention comprehensible, an embodiment accompanied with figures is described in detail below.

DESCRIPTION OF THE EMBODIMENTS

First Embodiment

Figure 1:
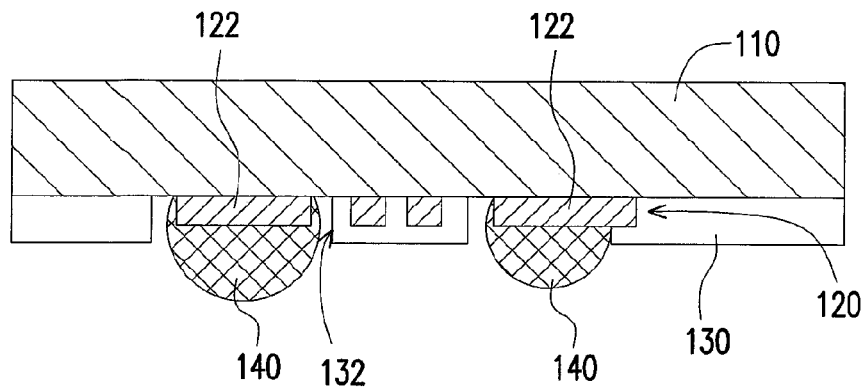
FIG. 1 is a section view of a circuit board of prior arts.
Figure 2A:
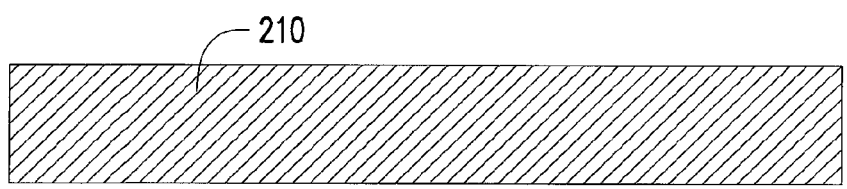
FIG. 2A~FIG. 2F are diagrams of the flow of fabricating the circuit board structure with concave conductive cylinders of the first embodiment of the invention.
Figure 2B:
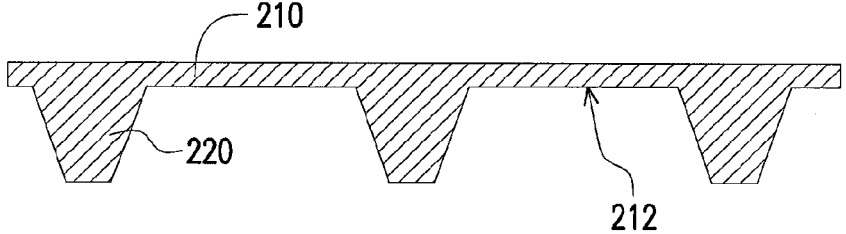

FIG. 2A~FIG. 2F are flow diagrams of fabricating the circuit board structure with concave conductive cylinders of the first embodiment of the invention. With reference to FIG. 2A, first a conductive layer 210 is provided, the conductive layer 210 for example is a metal layer, the material of the conductive layer 210 may be copper. Next, with reference to FIG. 2B, partially etching the conductive layer 210 is conducted, so that a plurality of conductive cylinders 220 are formed on the surface 212 of the conductive layer. In another embodiment which is not shown, the conductive cylinders 220 may also be formed on the surface 212 of the conductive layer 210 through forming bumps using welding wire machine or through other appropriate method.

Figure 2C:
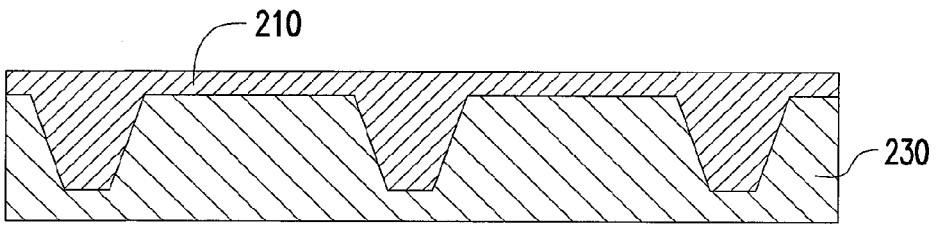
Figure 2D:
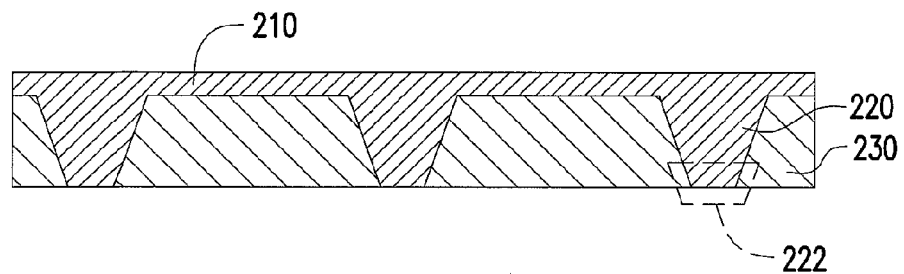

Next, with reference to FIG. 2C, a dielectric layer 230 is formed on the surface 212 of the conductive layer 210 on which the conductive cylinders 220 are formed. The method of forming the dielectric layer 230 on the conductive layer 210 includes laminating a dielectric material and the conductive layer 210 together, or forming the dielectric layer 230 on the conductive layer 210 through the method of printing dielectric material. Next, with reference to FIG. 2D, the tips 222 of the conductive cylinders 220 on a surface 232 of the dielectric layer 230 far away from the conductive layer 210 are exposed. For example, before the dielectric material is cured, laminate the conductive layer 210 to the dielectric material directly, until the tips 222 of these conductive cylinders 220 are exposed out of the dielectric material. Or, after the dielectric material is cured, a grinding process is employed until the tips 222 of the conductive cylinders 220 are exposed out of the cured dielectric material.

Figure 2E:
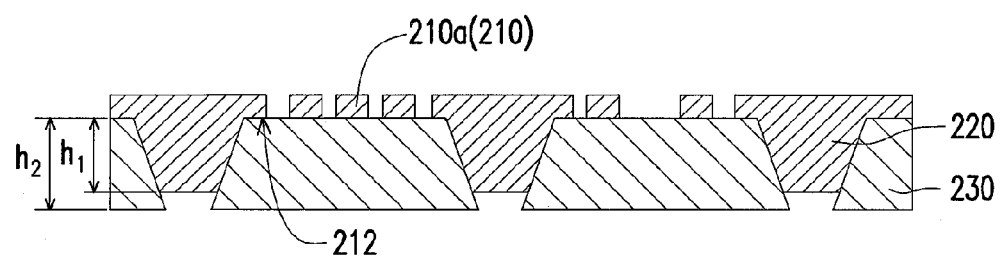
Figure 2F:
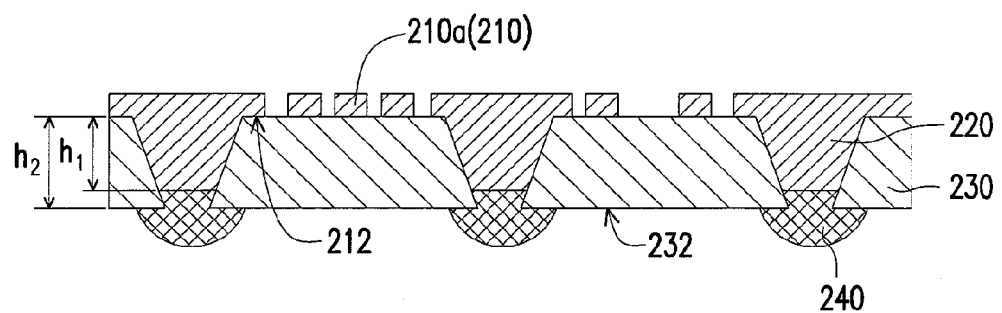

Next, with reference to FIG. 2E, the tips 222 of the conductive cylinders 220 may be removed through etching method or the like, so that the height h1 of the conductive cylinders 220 is lower than the height h2 of the dielectric layer 230. In addition, in the present embodiment, during the process of etching the conductive cylinders 220, the conductive layer 210 may be partially etched in the same time, so as to form the patterned conductive layer 210a, and the fabricating steps are therefore reduced. Next, with reference to FIG. 2F, in the present embodiment, after the tips 222 of the conductive cylinders 220 are removed, a solder material is disposed on the conductive cylinders 220 sunk into the dielectric layer 230 through electroplating or printing method, so that a solder material layer 240 is formed.

In other words, after the previous fabricating method is performed, a circuit board structure 200 with concave conductive cylinders can be fabricated. Moreover, the circuit board structure 200 with concave conductive cylinders further includes a conductive layer 210 (patterned conductive layer 210a), a plurality of conductive cylinders 220 and a patterned dielectric layer 230.

As shown in FIG. 2E, the conductive cylinders 220 are formed on a surface 212 of the conductive layer 210, and electrically connected to the conductive layer 210. The patterned dielectric layer 230 covers the surface 212, wherein the tips 222 of the conductive cylinders 220 are exposed on a surface 232 of the patterned dielectric layer 230 far away from the conductive layer 210, and the height of the conductive cylinders 220 is relatively lower than the patterned dielectric layer 230 to sink into the patterned dielectric layer 230. In addition, in FIG. 2F, the circuit board structure 200 with concave conductive cylinders further includes a solder material layer 240 formed on the conductive cylinders 220 to rise above the patterned dielectric layer 230. In addition, the material of the conductive layer 210 is the same as the conductive cylinders 220; the material thereof includes copper, aluminium or the alloy thereof.

It has to be addressed herein, the circuit board structure 200 with concave conductive cylinders may be applied in chip package structure of different forms, and the appearance thereof may vary with the requirements of designers. In addition, the circuit board structure 200 with concave conductive cylinders may further includes a plurality of conductive layers 220 and a plurality of patterned dielectric layers 230 which are disposed interlayering with each other. Therefore the present embodiment is only exemplary, and is not to limit the invention. In addition, the circuit board structure 200 with concave conductive cylinders is not limited to the fabricating method of the present embodiment to fabricate.

Second Embodiment

FIG. 3A~FIG. 3F are diagrams of the flow of fabricating the circuit board structure with concave conductive cylinders of the second embodiment of the invention. The present embodiment is similar to the previous embodiment, the only difference is that: in the previous embodiment, the dielectric layer 230 is formed after the conductive cylinders 220 are formed; while in the present embodiment, the dielectric layer 320 is formed before the conductive cylinders 330 are formed. Refer the following descriptions for the flow detail, the similarities thereof will not be repeated.

Figure 3A:
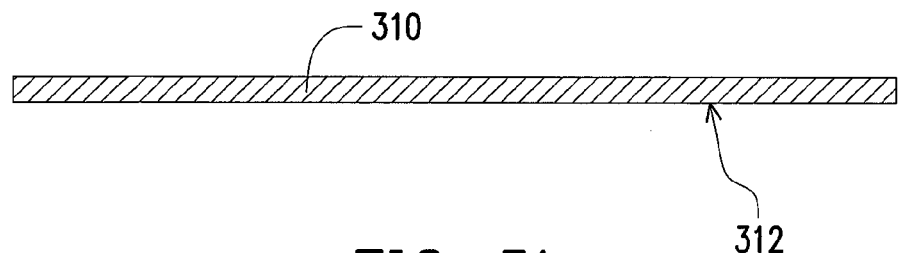
FIG. 3A~FIG. 3F are diagrams of the flow of fabricating the circuit board structure with concave conductive cylinders of the second embodiment of the invention.
Figure 3B:
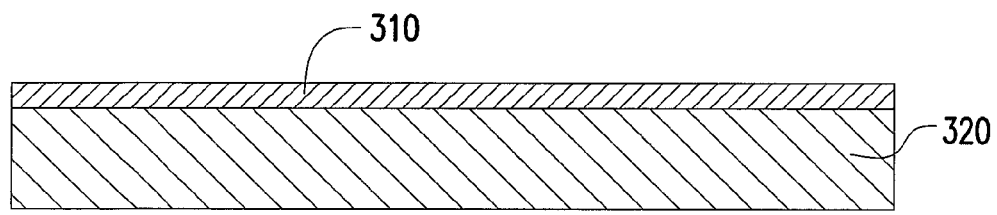

With reference to FIG. 3A, a conductive layer 310 which has a surface 312 is formed. Next, with reference to FIG. 3B, by using laminating method or printing method or the alike, a dielectric layer 320 is formed on the surface 312 of the conductive layer 310 on which the conductive cylinders 330 are formed. Further next, with reference to FIG. 3C, a plurality of vias 322 are formed in the dielectric layer 320 by using laser drilling or lithography method, so as to expose a portion of the surface 312 of the conductive layer 310.

Figure 3C:
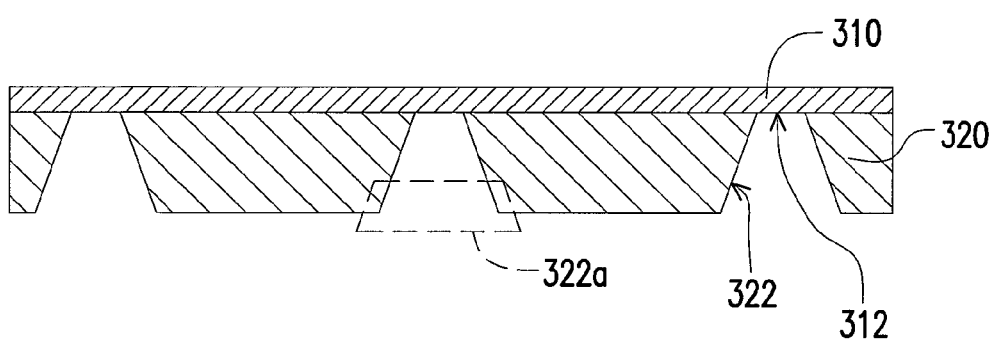
Figure 3D:
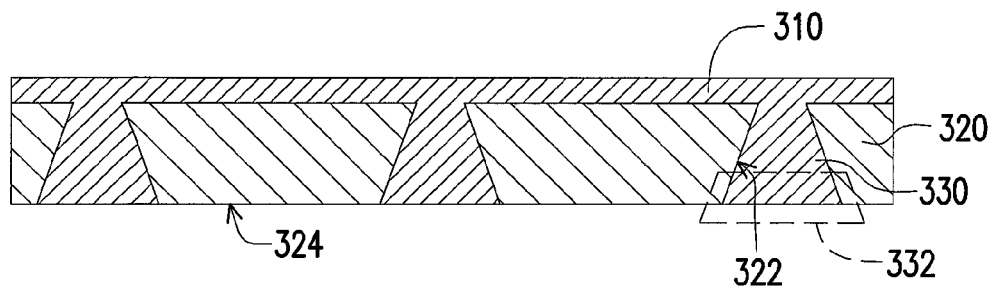

Next, with reference to FIG. 3D, through for example printing and filling, electroplating, sputtering or vapour deposition method to fill a conductive material into the vias 322, so as to form a plurality of conductive cylinders 330 on the surface of the conductive layer 310, wherein the tips of the conductive cylinders 330 are respectively exposed from the vias 322. In the present embodiment, the conductive material includes copper, copper paste, silver paste or conductive polymeric material. Further next, with reference to FIG. 3E, for example etching method is used to remove the exposed tips 332 of the conductive cylinders 330, so that the height h3 of the conductive cylinders 330 is relatively lower than the height h4 of the dielectric layer 320. When the tips 332 of the conductive cylinders 330 are etched, the patterned conductive layer 310a may also be formed simultaneously. Further next, with reference to FIG. 3F, a solder material layer 340 is formed on the surface of the conductive cylinders 330.

Figure 3E:
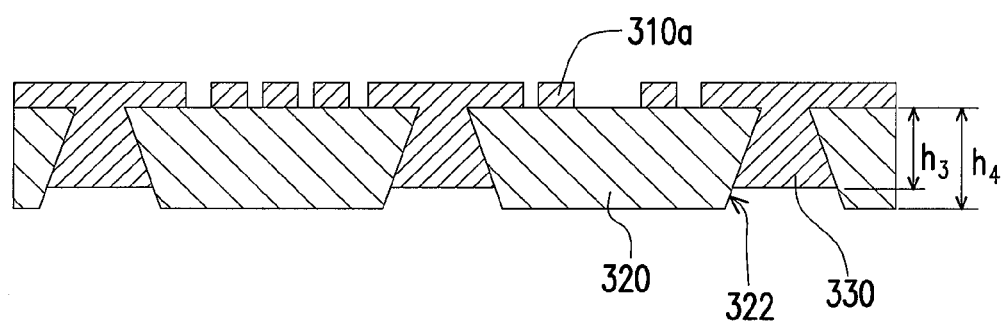
Figure 3F:
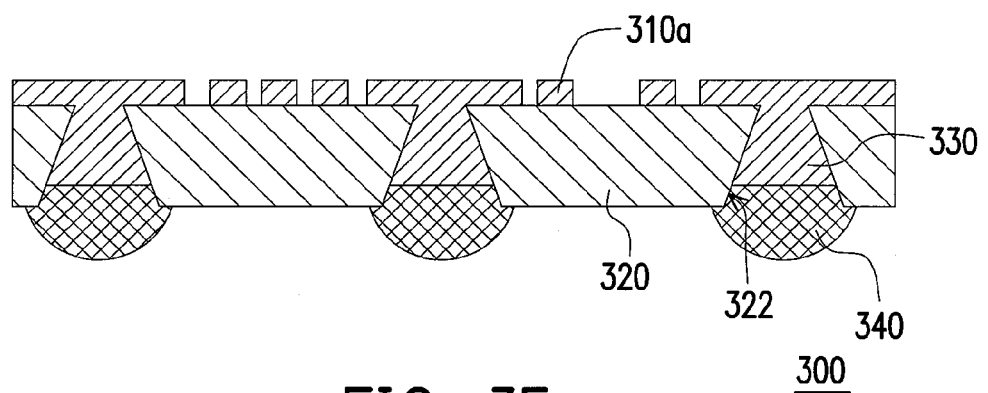

By the way, in another embodiment, when filling conductive material into the vias 322 through electroplating method, the surface 324 (as shown in FIG. 3D) of the dielectric layer 320 may also be plated a layer of metal. Next, expose the surface 324 of the dielectric layer 320 through grinding or etching method. In addition, in another embodiment, when filling conductive material into the vias 322, the height h3 (as shown in FIG. 3E) of the formed conductive cylinders 330 is controlled through disposing a plating mask layer at the openings 322a (as shown in FIG. 3C) of the vias 322, so that the height h3 of these conductive cylinders 330 is relatively lower than the height h4 (as shown in FIG. 3E) of the dielectric layer. Thus, the step for removing the tips 332 of the conductive cylinders 330 may be omitted.

Through the previous fabrication, the circuit board structure 300 (with reference to FIG. 3F) with concave conductive cylinders may be fabricated. The structure thereof is similar to the circuit board structure 200 (with reference to FIG. 2F) with concave conductive cylinders of the previous embodiment. Briefly, the circuit board structure 300 with concave conductive cylinders includes a conductive layer 310 (patterned conductive layer 310a), a plurality of conductive cylinders 330 and a patterned dielectric layer 320, wherein these conductive cylinders 330 are sunk into the patterned dielectric layer 320. In addition, in FIG. 3F, the circuit board structure 300 with concave conductive cylinders may further include a solder material layer 340.

To sum up, since the invention forms the dielectric layer on the outside of the conductive layer, therefore the solder mask layer may be substituted to ensure that the conductive layer does not contact the solder material. Therefore, the problem in the prior arts, that the solder mask layer has to be aligned to the pads which results in solder mask opening drift, or the problem that the solder mask openings are too small when image transfers can be avoided. In addition, since the conductive cylinders are sunk into the dielectric layer, so that solder material can be filled in the dielectric layer, thus the structural intensity is better, so that the solder material effectively contacts with the conductive cylinders. Therefore the bonding reliability between the solder material and the conductive cylinders is improved, and no pads need to be disposed additionally.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for fabricating a circuit board structure with concave conductive cylinders, comprises:
   providing a conductive layer;
   forming a dielectric layer on a surface of the conductive layer;
   forming a plurality of vias in the dielectric layer, wherein the vias expose the surface of the conductive layer; and
   filling a conductive material in the vias to form a plurality of conductive cylinders on the surface of the conductive layer, so that the tips of these conductive cylinders are exposed on a surface of the dielectric layer far away from the conductive layer, wherein the height of the formed conductive cylinders is controlled through disposing a plating mask layer at the openings of the vias, so that the height of the conductive cylinders is relatively lower than that of the dielectric layer and the conductive cylinders sunk into the dielectric layer.

2. The method for fabricating a circuit board structure with concave conductive cylinders of claim 1, wherein the step of forming the dielectric layer comprises:
   laminating or printing a dielectric material on the surface of the conductive layer.

3. The method for fabricating a circuit board structure with concave conductive cylinders of claim 1, wherein the method of forming the vias comprises laser drilling.

4. The method for fabricating a circuit board structure with concave conductive cylinders of claim 1, wherein the method of filling the conductive material in the vias comprises printing and filling, electroplating, sputtering or vapour deposition method.

5. The method for fabricating a circuit board structure with concave conductive cylinders of claim 4, wherein the conductive material filled in the vias comprises copper, copper paste, silver paste or conductive polymeric material.

6. The method for fabricating a circuit board structure with concave conductive cylinders of claim 1, wherein the material filled in these vias comprises copper, copper paste, silver paste or conductive polymeric material.

7. The method for fabricating a circuit board structure with concave conductive cylinders of claim 1, wherein after forming the conductive cylinders, further comprises:
   disposing a solder material on the conductive cylinders sunk into the dielectric layer, so as to rise the solder material above the dielectric layer.

* * * * *